United States Patent [19] [11] Patent Number: 4,602,282
Kurono et al. [45] Date of Patent: Jul. 22, 1986

[54] MEASURING DEVICES FOR TWO-DIMENSIONAL PHOTON-CAUSED OR CORPUSCULAR-RAY-CAUSED IMAGE SIGNALS

[75] Inventors: Takehiro Kurono; Yutaka Tsuchiya; Eiji Inuzuka; Teruo Hiruma, all of Hamamatsu, Japan

[73] Assignee: Hamamatsu Photonics Kabushiki Kaisha, Hamamatsu, Japan

[21] Appl. No.: 506,401

[22] Filed: Jun. 21, 1983

[30] Foreign Application Priority Data

Jun. 29, 1982 [JP] Japan ................................ 57-112095
Oct. 8, 1982 [JP] Japan ................................ 57-177158

[51] Int. Cl.⁴ ............................................... H04N 7/18
[52] U.S. Cl. ..................................... 358/110; 358/107; 358/111; 358/167; 358/211
[58] Field of Search ............... 358/110, 111, 107, 211, 358/167, 93; 250/363 R, 363 SR

[56] References Cited

U.S. PATENT DOCUMENTS 3,011,057 11/1961 Anger ............................ 250/363 SR
4,389,670 6/1983 Davidson ............................ 358/107

FOREIGN PATENT DOCUMENTS 31732 7/1981 European Pat. Off. .
1377783 12/1974 United Kingdom .
1562545 3/1980 United Kingdom .
1570221 6/1980 United Kingdom .

OTHER PUBLICATIONS

"The Most Sensitive Imaging Detectors Known", Surface Science Laboratories, Inc., Mtn. View, California, copy received Jul. 10, 1982.

Primary Examiner—Howard W. Britton
Attorney, Agent, or Firm—Spencer & Frank

[57] ABSTRACT

New types of devices for measuring two-dimensional photon-caused or corpuscular-ray-caused image signals by means of a special television imaging technology suitable for an extremely low level of incident visible light, infra-red, ultra-violet, X-rays, γ-rays, protons or neutrons are disclosed. These image signals are sensed by an electron emitting layer, i.e., a photoelectric emitter or a secondary electron emitter, which can respond to photons or corpuscular rays, and then amplified by a micro-channel-plate which can multiply the emitted electrons to a finite number with their positional relationships remaining in the two-dimensional area. The amplified signals are digitally processed to be displayed on a television picture monitor. The image signals on the television picture monitor can be printed out or saved in magnetic media.

26 Claims, 13 Drawing Figures

MEASURING DEVICES FOR TWO-DIMENSIONAL PHOTON-CAUSED OR CORPUSCULAR-RAY-CAUSED IMAGE SIGNALS

BACKGROUND OF THE INVENTION

This invention relates to measuring devices for two-dimensional photon-caused or corpuscular-ray-caused image signals with levels in the quantum number order which can vary with time, and especially to measuring devices for those picture signals when photons, electrons, IR, UV, X-rays, γ-rays, ions, or neutrons are incident on a two-dimensional addressable area.

A television camera utilizing high-sensitivity imaging tubes has conventionally been used to detect optical images of extremely low intensity.

A silicon electron-multiplier vidicon consisting of a photoelectric layer, a silicon semiconductor target located opposite said photoelectric layer, and an electron gun used to scan said silicon semiconductor target by means of the electron beam, or another silicon electron-multiplier vidicon with an image intensifier in front of said photoelectric layer, has been used as an imaging tube in said camera.

Said television camera can be used to pick up images under illumination above a threshold on the order of several tenths of milli-luxes to several milli-luxes. Such illumination corresponds to $10^8$ to $10^9$ photons/cm$^2$·sec on the photoelectric layer. If a read operation is stopped while an optical image is incident on the photoelectric layer in this type of camera, signals corresponding to the optical image on the photoelectric layer can be stored in the target and it increases the sensitivity of the camera. As well as photoelectrons, the target, however, may store thermal electrons which occur in the photoelectric layer and target itself. In addition, charges on the target can leak. Low contrast causing inferior picture quality in spite of increased sensitivity results from the thermal electrons or charges on the target. An imaging tube with said target inherently provides a narrow dynamic range, i.e., up to $10^3$.

Another photographic or television camera also has conventionally been used to detect the image of corpuscular rays formed in accordance with the two-dimensional distribution of incident corpuscles. The former uses photographic films, and the latter uses images tubes to pick up fluorescence of a phosphor layer excited by corpuscular rays.

For a sufficient amount of corpuscular rays, said photographic films or imaging tubes can detect images of the corpuscular rays. For an insufficient amount of corpuscular rays, images resulting from measurement have lower S/N ratios and only data of insufficient quality can be obtained.

If corpuscular rays are incident on an imaging tube to pick up fluorescence of a phosphor excited by corpuscular rays for a long period of time, thermal electrons may be stored in the target of the imaging tube or the contrast of an image taken by the imaging tube is lowered by leakage of charges forming the image. This type of imaging tube provides a narrow dynamic range, i.e., up to $10^3$.

The inventors of the present invention present signals identifying the location where electrons are multiplied in single-photoelectron units when these electrons are generated from the photoelectric layer on which photons are incident, and also measure an image with a contrast under lower illumination than that under which any image can be picked up by the conventional television camera, or under low-intensity corpuscular rays per unit time. The inventors have found that two-dimensional images of extremely low intensity can be measured by counting the frequency of occurrence of photoelectrons from the respective locations. There were two problems to be solved for realizing said measuring concept utilizing an imaging tube consisting of a photoelectric layer, micro-channel-plate, and semiconductor position detector.

The first problem lies in dissecting a signal, caused by a unit of photons falling at a specific location with respect to the semiconductor position detector after multiplication by the micro-channel-plate, from thermal noises caused by both the micro-channel-plate and semiconductor position detector themselves.

The second problem lies in that, within certain time spans between generation of succeeding photoelectrons from anywhere on the entire surface of the photoelectric layer in said imaging tube, locations cannot be resolved, although the average of the locations designated within those time spans can satisfactorily be resolved.

Since input signals caused by two or more separate photoelectrons cannot be resolved if the input signals occur within a certain finite period of time, information regarding an assumed location other than the locations where the respective input signals were applied, or information regarding averaged values of these locations, will be issued. That is, if time spans between the generation of succeeding photoelectrons cannot be resolved using the semiconductor position detector, the semiconductor position detector issues noises regardless of the images to be reproduced although input signals are generated from photoelectrons. The second problem lies in such noises inherent in the detected signals.

The problem of noises inherent in the detected signals is not so essential as said first problem of noises inherent in the imaging devices, and the probability that different time spans cannot be resolved is extremely low and is negligible in some cases.

The inventors of the present invention solved the problem of noises inherent in said measuring device as follows:

The multiplication factor of the micro-channel-plate is selected to be suitable for amplifying photoelectrons caused by a pluarality of separate photons until they become greater than the noise level inherent in said measuring device, and also it is selected to be suitable for minimizing variations in the amplification factor. Noises are then eliminated by a pulse amplitude selector with a threshold established between a signal caused by a unit of photons and noises inherent in said measuring device.

The problem of noises inherent in said input signal can be solved as follows: If the micro-channel-plate output caused by two or more photoelectrons is applied to the semiconductor position detector simultaneously or in time spans that cannot be resolved, the output of the semiconductor position detector is greater than that for a single photoelectron. Hence, a pulse amplitude selector with a threshold established between an input signal caused by a unit of photons and noises inherent in said measuring device can be used to separate the desired signal from noises.

An objective of the present invention is to provide measuring devices, for two-dimensional photon-caused picture signals, which can measure with some degree of contrast the two-dimensional image signals that can be separated within the established time spans when a plurality of separate photons are incident on the target surface, i.e., the two-dimensional photon-caused image signals under illumination in the range of $1/10^3$ to $1/10^8$ of the limit under which images can be picked up by the conventional television camera.

Another objective of the present invention is to provide measuring devices for two-dimensional photon-caused image signals where the problem of noises inherent in said measuring device and the problem of noises inherent in the input signals can be solved.

A further objective of the present invention is to provide measuring devices for two-dimensional photon-caused image signals, the measuring devices having output devices used to output in real time the results or intermediate results of measurement of said two-dimensional photon-caused image signals.

A further objective of the present invention is to provide measuring devices for corpuscular-ray-caused image signals which may reproduce a two-dimensional image with some degree of contrast in such levels that the input signal, in units of electrons generated by the electron emitting plane on which corpuscular rays from the source of the image to be measured are incident, cannot be separated within a time span, or that the input signals in single electron units cannot be separated within a time span.

A further objective of the present invention is to provide a measuring device for corpuscular-ray-caused image signals where the problem of noises inherent in both said measuring device and the input signals has been solved.

A further objective of the present invention is to provide measuring devices for corpuscular-ray-caused image signals, the measuring devices having output devices to output in real time the results or intermediate results of measurement of said corpuscular-ray-caused image signals.

SUMMARY OF THE INVENTION

A measuring device for two-dimensional photon-caused image signals in accordance with the present invention is a measuring device to measure a two-dimensional image where photons generated responding to the incident light from the image being measured are in such an order that each unit of photons can separately be measured in a time domain; and it consists of an imaging tube containing a photoelectric layer, a micro-channel-plate which can multiply electrons coming from said photoelectric layer until each of them is multiplied by a predetermined finite number each time a unit of photons strike said photoelectric layer, and a two-dimensional semiconductor position detector located on the opposite side against the electron emitting plane of said micro-channel-plate; an incident-light-position calculation circuit which can perform an operation to determine the specific position, at which a batch of electrons are incident on said two-dimensional semiconductor position detector, in accordance with the output signals from the position signal electrodes of said two-dimensional semiconductor position detector; a number-of-electrons caculation circuit which can count the number of electrons incident upon said two-dimensional semiconductor position detector, corresponding to the quantity of the incident light, by performing an addition of the output signals from the position signal electrodes of said two-dimensional semiconductor position detector; a decision circuit which can generate a decision signal to indicate if the output of said number-of-electrons calculation circuit corresponds to a unit of photon level; and a two-dimensional counter array where the respective unit signals are counted by counters at the addresses specified by the output signals of said incident-light-position calculation circuit if the output of said number-of-electrons calculation circuit is found to correspond to a unit photon level when checked by said decision circuit.

Images of extremely low intensity can be detected with an extended dynamic range by using a measuring device constructed in accordance with said configuration. When images are measured with a measuring device constructed in accordance with the present invention, under such intensity that images cannot be picked up by using a conventional imaging tube, images with an enhanced dynamic range can be obtained with acceptable quality.

A measuring device for two-dimensional corpuscular-ray-caused image signals in accordance with the present invention is a measuring device to measure a two-dimensional image where electrons generated corresponding to the corpuscular rays from the object being measured are in such an order that the frequency of occurrence of electrons can separately be measured in a time domain; and it consists of an electron emitting plane; a micro-channel-plate which can multiply electrons from said electron emitting plane until each of them is multiplied by a predetermined finite number each time a single electron strikes said electron emitting plane; and a two-dimensional semiconductor position detector located on the opposite side against the electron emitting plane of said micro-channel-plate; an incident-light-position calculation circuit which can perform an operation to determine the specific location at which a batch of electrons are incident on said two-dimensional semiconductor position detector, in accordance with the output signals from the position signal electrodes of said two-dimensional semiconductor position detector; a number-of-electrons calculation circuit which can count the number of electrons incident upon said two-dimensional semiconductor position detector, corresponding to the quantity of the incident light, by performing an addition of the output signals from the position signal output electrodes of said two-dimensional semiconductor position detector; a pulse amplitude selector which can generate a decision signal to indicate if the output of said number-of-electrons calculation circuit corresponds to a single electron level; and a two-dimensional counter array where the respective unit signals are counted by counters at the addresses specified by the output signals of said incident-light-position calculation circuit when the output of said number-of-electrons calculation circuit is found to correspond to a single electron level when checked by said decision circuit.

Images of extremely low intensity can be detected with an extended dynamic range by using a measuring device constructed in accordance with said configuration.

DESCRIPTION OF THE EMBODIMENTS

Figure 1:
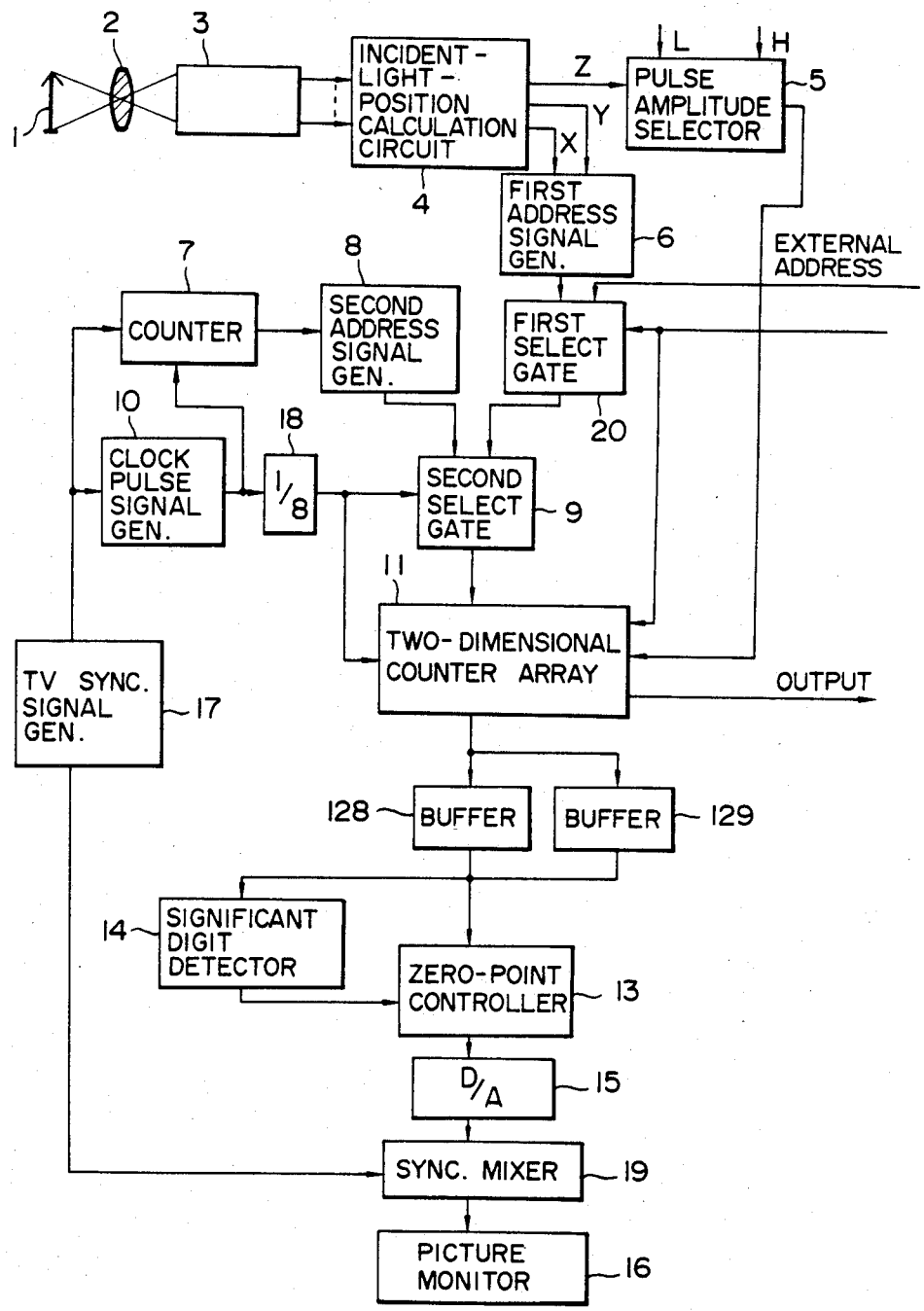
FIG. 1 shows a block diagram of a first embodiment of a device for measuring two-dimensional photon-caused image signals in accordance with the present invention.

FIG. 1 shows a block diagram of the first embodiment of the present invention and represents a device for measuring two-dimensional photon-caused image signals.

An image of object 1 is formed on the photoelectric layer of imaging tube 3, the image passing through optical system 2.

The intensity of the image of object 1 on the photoelectric layer of imaging tube 3 is of such an order that a small number of photoelectrons occur, at a rate of up to $10^4$ per second, in the photoelectric layer of each imaging tube.

Illumination under which images can be picked up with an imaging device in accordance with the present invention is $1/10^3$ to $1/10^8$ of the lowest limit in conventional devices with respect to both the quantum efficiency and the size of the photoelectric layer.

If the object is of high brightness, the number of photons incident upon the photoelectric layer should be decreased by a low-transmissivity neutral density filter so that the illumination is reduced to $1/10^3$ to $1/10^8$ of the lowest limit in the conventional devices.

Figure 2:
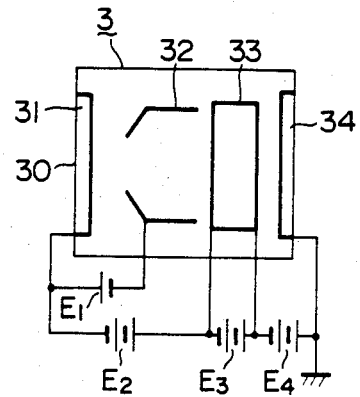
FIG. 2 shows the concise layout of the imaging tube in the first embodiment of the present invention.

The configuration of said imaging tube 3 used in a device constructed in accordance with the present invention will be described hereafter referring to FIG. 2.

Photoelectric layer 31 forms a photoelectron source to emit electrons corresponding to the image of photons incident upon the photoelectric layer in accordance with the object being picked up.

In the present embodiment, the photoelectric layer is composed of alkali metal and antimony. Photoelectric layer 31 is formed on the inner wall of window 30 for accepting incident light, which constitutes part of evacuated envelope 3. An image of photoelectrons emitted from photoelectric layer 31 is focused on an electron-incident plane of micro-channel-plate 33 through focusing electrode 32. Micro-channel-plate 33 provides a number of through-holes (channels) leading to the electron emitting plane from the electron-incident plane, and a layer to emit secondary electrons is formed on the inner surface of said through-holes. Electrons incident upon the electron-incident plane of micro-channel-plate 33, which remain in their original positions, are multiplied and then emitted from the electron emitting plane of micro-channel-plate 33. Each channel is bent and it has a channel length greater than 100 times the channel diameter so that the multiplication factor by which a single photoelectron caused by the incident light can be multiplied may approach a limit.

This increases the resistance of a dynode formed on the inner surface of each channel.

In the above configuration, the multiplication factor for a single photoelectron is set to a certain value. In the above configuration, noises occurring in micro-channel-plate 33 due to each single photoelectron can be dissected from those occurring in the inner surface of each channel due to thermal effects.

Semiconductor position sensor 34 is a two-dimensional position sensor which can issue current signals corresponding to the location where electrons fall on the electron-incident layer.

Power source E1 is connected between focusing electrode 32 and photoelectric layer 31, power source E2 between photoelectric layer 31 and the electron-incident plane of micro-channel-plate 33, power source E3 between the electron-incident and electron emitting planes of micro-channel-plate 33, and power source E4 between the electron emitting plane of micro-channel-plate 33 and semiconductor position sensor 34.

Semiconductor position sensor 34 will be described hereafter together with the incident-light-position calculation circuit 4 shown in FIG. 1.

Incident-light-position calculation circuit 4 performs processing of the signals output from imaging tube 3. During processing, position signals, in orthogonal coordinates (X and Y) starting with an origin defined by the center of semiconductor position sensor 34, which corresponds to the center of photoelectric layer 31, are obtained from the location of light incident on photoelectric layer 31 of imaging tube 3. Furthermore a brightness signal (Z), represented in terms of the number of electrons incident upon semiconductor position sensor 34, is also obtained.

Pulse amplitude selector 5 is a window-type comparator which utilizes a first threshold L established between the mean value of the brightness signal Z obtained by incident-light-position calculation circuit 4 due to a single photoelectron and the output of micro-channel-plate 33 due to thermal noises, and a second threshold H between the mean value of said brightness signal Z and the output of micro-channel-plate 33 due to high-level noises inherently contained in said signal.

In some cases, the second threshold can be eliminated, and then signals having levels greater than the first threshold can pass through pulse amplitude selector 5.

First address signal generator 6 consists of an analog-to-digital converter which generates an address signal, corresponding to the X and Y signals provided by incident-light-position calculation circuit 4, to specify a respective counter address in two-dimensional counter array 11.

Counter 7 is used to count the output pulses of clock pulse signal generator 10, and can be reset by the horizontal and vertical sync signals from sync signal generator 17. A count which can be reset by the vertical sync signal represents a value on the Y coordinate, and a count which can be reset by the horizontal sync signal represents a value on the X coordinate.

Second address signal generator 8 is used to convert the output of counter 7 into corresponding address signals to specify addresses of two-dimensional counter 11. First select gate 20 selects either the output (write address signal) of first address signal generator 6 or an external address signal (read address signal); it then issues the selected one to second select gate 9.

Second select gate 9 selects either the output of first select gate 20 or the output of second address signal generator 8 in accordance with the output of divide-by-eight counter 18; it then issues the selected one to two-dimensional counter 11.

Two-dimensional memory 111 in two-dimensional counter array 11 is composed of a plurality of counters arranged corresponding to the respective elements in a two-dimensional area.

The configuration of two-dimensional counter array 11 will be described, in detail, referring to FIG. 6. Two-dimensional counter array 11 consists of two-dimensional memory 111, buffer memory 112 connected to the respective data output terminals of two-dimensional memory 111, third select gate 114 which selectively issues the outputs of buffer memory 112 to incrementor 115 or external circuits in accordance with the external command, incrementor 115 which issues the input data plus one, input buffer memory 116 connected to both incrementor 115 and the data entry bus of two-dimensional memory 111, and read/write controller 121 which causes two-dimensional memory 111 to be enabled for a read/write operation.

When the output of pulse amplitude selector 5 is applied to first input terminal 122 of read/write controller 121, two-dimensional counter array 11 adds one (unit signal) to the contents of a constituent counter in the address specified by the output signal of first address signal generator 6. This mode of operation is called counting. The contents of the counter in the address specified by second address signal generator 8 are read for the picture monitor which will be described hereafter. The contents of two-dimensional counter array 11 are not reset during read operations.

Counting and reading will be described hereafter in detail.

Figure 6:
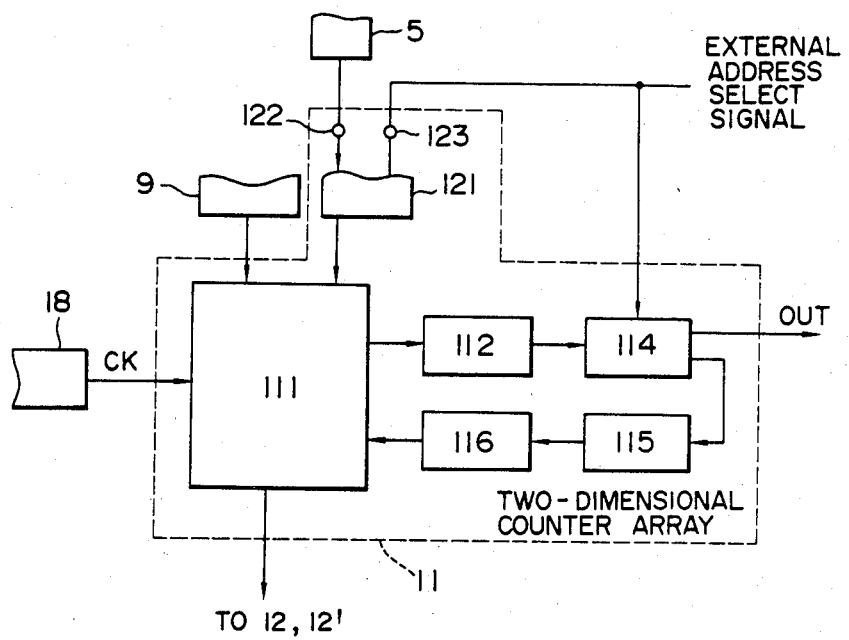
FIG. 6 shows a block diagram of the two-dimensional counter array in the first embodiment of the present invention.

Reference numbers 128 and 129 (see FIG. 1), corresponding to 12, 12' in FIG. 6, respectively, indicate buffer memories, and reference number 13 indicates a zero-point controller. The number of digits to be shifted at a time in the output (or parallel signal composed of a plurality of bits) of buffer memory 128 is determined by the output of significant digit detector 14. Significant digit detector 14 detects the leftmost position whose value is logical 1 among the digits arranged in buffer memory 128 in binary format. If the leftmost position whose value is logical 1 among the digits arranged in buffer memory 128 is not greater than the digit which has been detected before, the output of significant digit detector 14 remains unchanged. Shifting is carried out in zero-point controller 13 until the digit specified by significant digit detector 14 becomes the most significant digit of parallel data issued from zero-point controller 13. Reference number 15 indicates a digital-to-analog converter. Reference number 19 indicates a sync signal mixer which can generate a standard NTSC television video signal from digital-to-analog converter 15. Reference number 16 indicates a television picture monitor used to display video signals on CRT. This mode of operation is called reading in a television system. Only a limited number of digits starting with the most significant digit can be displayed on the TV picture monitor, and this avoids inferior contrast on the CRT due to limited dynamic range.

Figure 3:
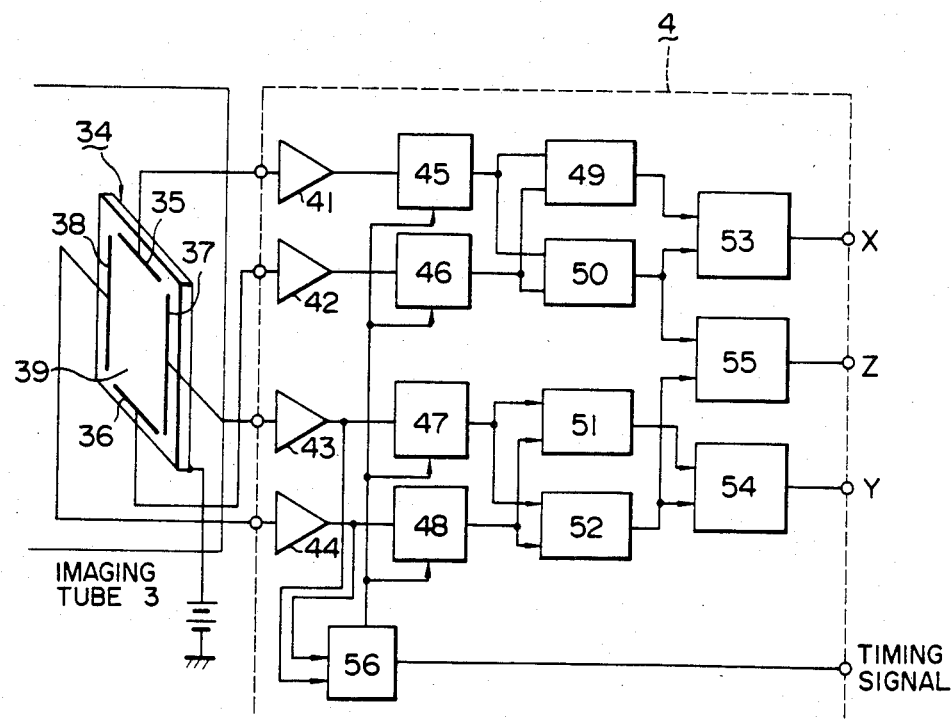
FIG. 3 shows a detailed block diagram of the semiconductor position sensor and incident-light-position calculation circuit in the first enbodiment of the present invention.

FIG. 3 shows a block diagram of semiconductor position sensor 34 and incident-light-position calculation circuit 4, which performs processing of data sent from said semiconductor position sensor 34. Semiconductor position sensor 34 consists of a p-n junction formed along the surface of a silicon wafer and four electronically isolated electrodes 35, 36, 37 and 38 arranged at the respective sides of a rectangular shaped area. Electrodes 35 and 36 are arranged along one pair of sides and electrodes 37 and 38 are arranged along the other sides. For each of the four electrodes 35-38, the electrical resistance along a path measured from an arbitrary point 39 on the rectangular shaped area defined by the four electrodes 35, 36, 37 and 38 to the respective electrode is proportional to the length of the path. When an electron falls on point 39, current inversely proportional to the distances from point 39 to the respective electrodes flows. During this time, electron multiplication can occur within the bulk of a silicon wafer corresponding to the energy of electrons which fall on the p-n junction. Reference numbers 41 through 44 indicate pulse amplifiers. Reference numbers 45 through 48 indicate integrators. Timing signal generator 56 adds the outputs of pulse amplifiers 43 and 44 to create a triggering signal for timing signal generation. The timing signals determine the timings at which integrators 45, 46, 47 and 48 start operation for integration, and they also determine the times of integration. For instance, the time of integration is set to be 6 $\mu$s. This time depends on the time constant for the output signal of semiconductor position sensor 34. This time is longer than the cycle time of a two-dimensional counter array which will be described hereafter.

If the timing signal generated by the circuit in FIG. 3 is delayed, the time of starting integration is delayed from the input signal. In this case, the accuracy of integration becomes inferior under some conditions. If any delay has occurred, delay circuits must be placed between said pulse amplifiers 41, 42, 43 and 44 and corresponding integrators 45, 46, 47 and 48, respectively.

In FIG. 3, a current flowing through electrode 35 is amplified by pulse amplifier 41 and the signal current obtained through integrator 45 will be identified as I 35; a current flowing through electrode 36 is amplified by pulse amplifier 42 and the signal current passing through integrator 46 will be identified as I 36; a current flowing through electrode 37 is amplified by pulse amplifier 43 and the signal current passing through integrator 47 is identified as I 37; and a current flowing through electrode 38 is amplified by pulse amplifier 44 and the signal current passing through integrator 48 will be identified as I 38.

Adder 50 adds I 35 and I 36 respectively sent from said integrators 45 and 46, and provides an output representing the sun (I 35+I 36).

Adder 52 adds I 37 and I 38 respectively sent from said integrators 47 and 48 and provides an output representing the sum (I 37+I 38). Adder 55 adds the outputs of adders 50 and 52 and provides an output representing the sum (I 35+I 36+I 37+I 38).

Subtractor 49 is used to obtain (I 35−I 36) and subtractor 51 to obtain (I 37−I 38).

Reference numbers 53 and 54 indicate dividers, respectively. The output signal X of divider 53 is given by the following expression:

$$X = (I\ 35 - I\ 36)/(I\ 35 + I\ 36) \quad (1)$$

The output signal Y of divider 54 is given by the following expression:

$$Y = (I\ 37 - I\ 38)/(I\ 37 + I\ 38) \quad (2)$$

The output signal Z of adder 55 is given by the following expression:

$$Z = (I\ 35 + I\ 36 + I\ 37 + I\ 38) \quad (3)$$

Assume that the center of a square defined by electrodes 35, 36, 37 and 38 arranged at the respective sides is defined as the origin, that each of the distances from the origin to the respective electrodes is identified as unity, that the coordinate defined by a line in the direction from electrode 36 to electrode 35 is the X-axis, and that the coordinate defined by a line in the direction from electrode 38 to electrode 37 is the Y-axis. Expressions (1), (2) and (3) mean the following:

Expression (1): Value on the X-axis, representing the point 39 upon which electrons are incident, (X);

Expression (2): Value on the Y-axis, representing the point 39 upon which electrons are incident, (Y); and Expression (3): Number of electrons which are incident on point 39, (Z).

Operation of the first embodiment of the measuring device in accordance with the present invention will, in detail, be described hereafter.

Before the start of operation, first select gate 20 should be connected between first address signal generator 6 and second select gate 9, and third select gate 114 should be connected between output buffer 112 and incrementor 115.

When photons are incident on imaging tube 3 while the image of object 1 is being picked up, photoelectrons are emitted from photoelectric layer 31 at a certain efficiency, for instance 20%, and then they strike micro-channel-plate 33. The positional relation between images on photoelectric layer 31 and micro-channel-plate 33 is held unchanged. Electrons falling on micro-channel-plate 33 are multiplied within micro-channel-plate 33 and then the multiplied electrons arrive at its electron emitting plane. The multiplied electrons from the electron emitting plane fall on semiconductor position sensor 34 while the positional relation between images on photoelectric layer 31 and micro-channel-plate 33 is held unchanged.

The relation between the first and second thresholds employed by pulse amplitude selector 5 in terms of the Z signal will be described hereafter referring to FIG. 4.

Figure 4:
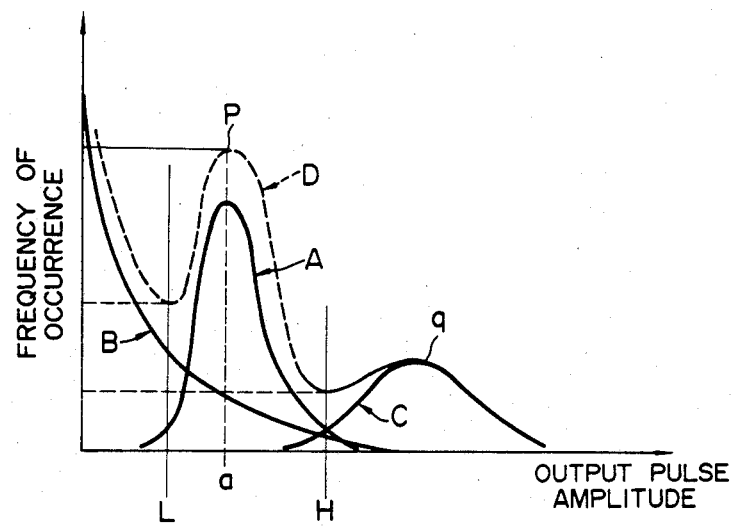
FIG. 4 shows curves of distributions for the Z signals issued from the incident-light-position calculation circuit in the first embodiment of the present invention.

FIG. 4 shows a set of curves with the Z signal on the X coordinate, and with the frequency of occurrence in each output range on the Y coordinate. A Z signal pulse is generated each time a single photoelectron is generated on photoelectric layer 31. Peak values p and q, as shown in FIG. 4, can appear while the same value of amplitude is expected to appear when a single photoelectron is generated. Curve D in FIG. 4 is estimated to be given by the sum of distribution B, representing the number of times that events have occurred due to thermal noises, distribution A, representing the outputs which have occurred due to each single photoelectron, and distribution C, representing the outputs which have occurred when photoelectrons have been generated successively in such a manner that successive photoelectrons cannot separately be recognized.

Thresholds L and H are established in pulse amplitude selector 5 in accordance with the present invention, and only a Z signal falling within the range defined by the two thresholds L and H, or the lower and upper limits, can thus be measured.

Both the X-coordinate and Y-coordinate signals from incident-light-position calculation circuit 4 are converted into an address signal for two-dimensional counter array 11 by first address signal generator 6, and the converted signal is fed through second select gate 9 to two-dimensional counter array 11. The address of two-dimensional counter array 11 can thus be specified. The maximum period of time which can be set for cyclic operation of incident-light-position calculation circuit 4 is longer than that defined for operating two-dimensional counter array 11, and data can be input to two-dimensional counter array 11 only when incident-light-position calculation circuit 4 issues outputs. Two-dimensional counter array 11 consists of 512 by 512 (or 262,144) counters; that is, two-dimensional memory 111 has 262,144 memory locations. The Z signal is fed from incident-light-position calculation circuit 4 to pulse amplitude selector 5. If the Z signal has a level between the upper and lower limits specified by the thresholds, pulse amplitude selector 5 issues a trigger pulse signal so as to add one to the contents of a constituent counter in the specified address of two-dimensional counter array 11. Any trigger pulses, other than those caused by thermal noises and by two or more photoelectrons, can be applied to two-dimensional counter array 11, and thus each count signal can be set corresponding to each single photoelectron.

The clock pulse frequency is selected so that each clock pulse corresponds to a respective address of two-dimensional counter array 11, and also so that the retrace period of television scanning may effectively be used. As described above, the address in the X-coordinate is defined as a count set after counter 7 is reset by the horizontal drive signal during clocking at the above clock frequency.

The counter need not count the clock pulses for obtaining the address in the Y-coordinate. The address in the Y-coordinate can be obtained by counting the number of horizontal drive pulses after the counter is reset by the vertical drive signal. Numbers issued from counter 7 should start with the leftmost position on the television picture monitor, so that the number in the leftmost position is identified as the origin, while the outputs of incident-light-position calculation circuit 4 start with the central position on the television picture monitor, which is identified as the origin. Compensation which will be described hereafter is thus needed for interlace scanning during a read operation. Second address signal generator 8 converts the output of counter 7 into an address signal for two-dimensional counter array 11. For example, said compensation is carried out by subtracting 512/2=256 from the numbers issued from counter 7 on the X-coordinate; and by subtracting 245 from the value twice the numbers issued from counter 7 in each horizontal line for the first field and subtracting 244 from the same value for the second field in the Y-coordinate direction.

Figure 5:
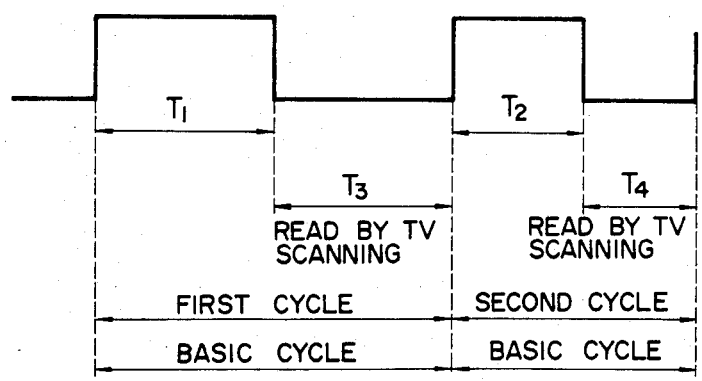
FIG. 5 shows a waveform of the pulse voltage issued from the clock pulse generator to the divide-by-eight counter in the first embodiment of the present invention.

Second select gate 9 is controlled by the pulse signal, divided by divide-by-eight counter 18, from clock pulse generator 10. FIG. 5 shows the waveform of the pulse signals issued from divide-by-eight counter 18. The pulse signals are used to control the basic timing of two-dimensional memory 111, and each signal consists of preceding and succeeding half cycles. The signal in the preceding half cycle is a logical 1 (representing the high level) and the signal in the succeeding half cycle is a logical 0 (representing the low level). Second select gate 9 selects either an address signal issued from first address signal generator 6 or an external address signal in the first half cycle, and the selected signal is used to read out the counter contents. It selects an address signal from second address signal generator 8 in the second half cycle, and the selected signal is used to read out the contents of two-dimensional counter array 11 in accordance with television scanning.

Pulse voltages issued from divide-by-eight counter 18 to second select gate 9 are also fed to two-dimensional counter array 11. The contents of two-dimensional memory 111 in the specified address are read out in the preceding half cycle of the basic timing $T_1$ in FIG. 5, and then one is added to these contents by using incrementor 115. The result of this addition is written into two-dimensional memory 111 in the same address in the preceding half cycle of the basic timing $T_2$ in FIG. 5. This operation allows said counting to be performed. The memory contents are non-destructively read out of eight successive addresses starting with the specified one in the succeeding half cycles of the basic timings $T_3$ and $T_4$ in FIG. 5. After reading out of the memory contents, these contents are used to read out data in accordance with television scanning.

The reason for reading out valves at eight addresses from the counter at a time is as follows: If the valve at one address is read from the counter in an arbitrary cycle, the time needed to read out data corresponds to the period of time determined by a frequency of 9.7 MHz if both the horizontal and vertical retrace periods are not used. Each read operation must be carried out in the succeeding half cycle, and the time necessary for each read operation is 52 ns. This time either cannot be realized or lies at the limit of time which can be realized. If data is read out of eight counters at a time, the time needed to read out data at a time is 416 ns. This time is much larger than the limit of time. This mode of read operation is carried out in accordance with the horizontal and vertical synchronizing signals issued from television sync signal generator 17. This mode of operation is called parallel-to-series conversion. As described above, two-dimensional counter array 11 consists of 512 by 512 counters. Video signals in a single horizontal scanning line can entirely be processed by 64 read operations if the contents of eight counters are read out at a time when a set of 512 counters correspond to one horizontal line. On the other hand, each television frame consists of video signals in 525 lines. However, 6.5% of the frame time corresponds to the vertical retrace period, and only 488 lines can be used to display video signals.

The output of eight counters within two-dimensional counter array 11 is once stored in first buffer memory 128, and the contents of each counter are successively read out. Data is read from first buffer memory 128 in the succeeding one cycle which corresponds to 816 ns. In the succeeding half cycle of the above period, the contents of two-dimensional counter array 11 are read out and transferred to second buffer memory 129. Hence, it is easily understood that a select gate to select first buffer memory 128 in one cycle and second buffer memory 129 in the other cycle is needed to receive the output of two-dimensional counter array 11. However, a description will be omitted because of the matter of clarity.

Signals issued from first buffer memory 128 or second buffer memory 129 are fed to both zero-point controller 13 and significant digit detector 14. Significant digit detector 14 can detect the leftmost digit position whose value is logical 1 among the digits issued from first buffer memory 128 or second buffer memory 129. This state is unchanged until logical 1 is input to any digit which is more significant than the above.

Zero-point controller 13 shifts the input signal in accordance with the output of significant digit detector 14. That is, shifting is carried out so that the digit position specified by significant digit detector 14 agrees with that appearing in the output of zero-point controller 13.

The output of zero-point controller 13 is converted into the corresponding analog signal with digital-to-analog converter 15, and then it is mixed with the horizontal or vetical drive signals fed from television sync signal generator 17 with a sync signal mixer 19. The obtained signal is fed to the video signal input of television picture monitor 16.

When the observer recognizes an image viewed on television picture monitor 16 to be the result of a sufficient number of photons, first select gate 20 is operated by an external address select signal issued in response to manual operation. First select gate 20 opens a gate between an external address signal generator (not shown) and second select gate 9. The external address select signal issued to two-dimensional counter array 11 is fed to both third select gate 114 and second input terminal 123 of read/write controller 121. In the preceding half ccle of basic timings $T_1$ and $T_2$ in FIG. 5, the memory is operated in the read mode. A gate between output buffer 112 and an external display (not shown) is opened while another gate between output buffer 112 and incrementor 115 is closed. In said preceding half cycle of basic timings $T_1$ and $T_2$, the memory is operated in the read mode.

An arbitrary address signal is fed from said external address signal generator to first select gate 20.

Digtially-formatted picture signals stored in two-dimensional memory 111 of two-dimensional counter array 11 can directly be read, and then these are fed to an external display or memory through third select gate 114.

The contents of two-dimensional memory 111 after read operations are carried out are unchanged if compared with those before the read operations are done.

A printer is an example of the external display devices, and a magnetic tape transport is an example of the external memories.

The read address may be the same as that used for displaying television picture signals or part of these signals.

The rate at which read operations are carried out corresponds to a half of the clock pulses at 9.7 MHz. Each counter contents are read each time a read operation is carried out. These relations can satisfactorily be understood in accordance with the first embodiment of the present invention.

The second embodiment of the present invention will be described hereafter.

Figure 7:
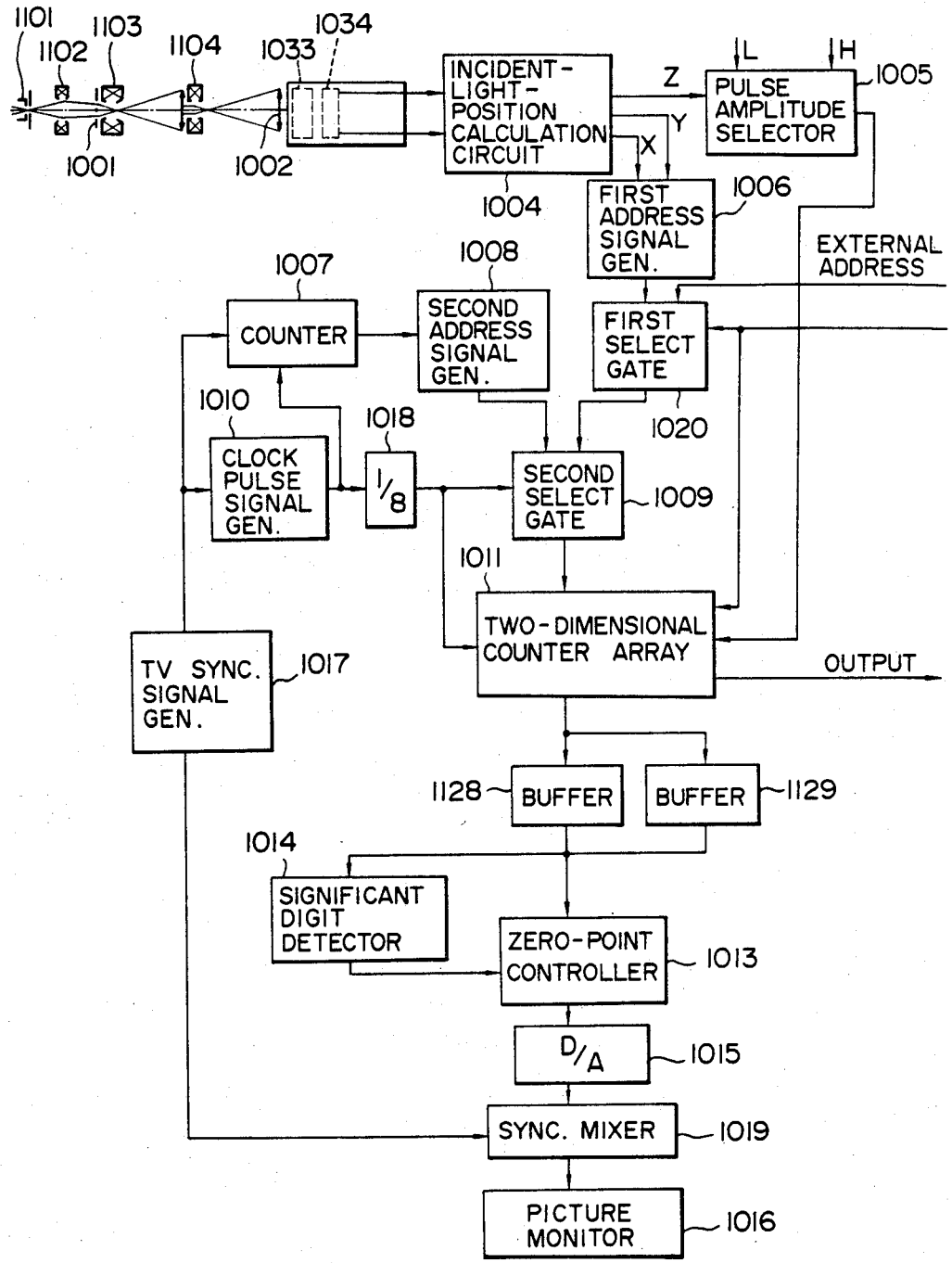
FIG. 7 shows a block diagram of a second embodiment representing a device for measuring two-dimensional corpuscular-ray-caused image signals in accordance with the present invention.

FIG. 7 shows a block diagram of the second embodiment of the present invention and represents a device for measuring two-dimensional corpuscular-ray-caused image signals.

The second embodiment of the present invention represents a measuring device wherein an electron microscope of the transmission type is used and electrons act as the corpuscular rays. The electrons are emitted from electron gun 1101 and strike specimen 1001 after passing through focusing lens 1102. Specimen 1001 corresponds to a layer which can emit secondary electrons. In the second embodiment of the present invention, the layer which can emit secondary electrons includes a material through which distribution of electrons uniformly incident thereon may be changed when secondary electrons are re-emitted.

An image of electrons passing through specimen 1001 is formed on the electron-incident plate of micro-channel-plate 1033 by using electron lenses 1103 and 1104. Both micro-channel-plate 1033 and semiconductor position sensor 1034 are housed in a vacuum system constituting an electron microscope. The image formed on the electron-incident plane of micro-channel-plate 1033 is multiplied by the micro channels of micro-channel-plate 1033.

Figure 8:
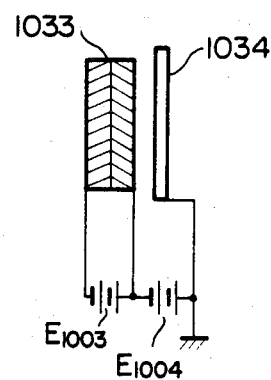
FIG. 8 shows the concise layout of the micro-channel-plate and semiconductor position sensor in the second embodiment of the present invention.

FIG. 8 shows the configuration of both micro-channel-plate 1033 and semiconductor position sensor 1034.

Power source E1003 is connected between the incident and emitting planes of micro-channel-plate 1033, and power source E1004 is connected between the electron emitting plane of micro-channel-plate 1033 and semiconductor position sensor 1034.

Micro-channel-plate 1033 provides a number of through-holes (called channels), each of which leads from the electron-incident plane to the electron emitting plane, and a layer from which secondary electrons can be emitted is formed on the inner wall of each of said through-holes. In the second embodiment of the present invention, said layer for emitting secondary electrons is made of lead oxide (PbO). Electrons falling on the electron-incident plane of micro-channel-plate 1033 are emitted from the electron emitting plane of micro-channel-plate 1033 while retaining the positional relation of the image established at the time of incidence. Each channel in micro-channel-plate is bent to approximate the multiplication factor of each electron incident on the inner-wall of each through-hole to a certain value. The channel length is 100 times or more of the channel diameter. The resistance of the dynode formed on the inner surface of each channel is high.

In this configuration, the amplification factor for a single electron becomes a certain value, and electrons from micro-channel-plate 1033 due to single electron can thus be dissected from thermal noises occurring in the inner surface of each channel.

Semiconductor position sensor 1034 is a two-dimensional sensor which issues a current signal corresponding to the position of incidence when electrons are incident on the electron-incident plane of semiconductor position sensor 1034.

Semiconductor position sensor 1034 will be described in detail together with the incident-light-position circuit 1004 shown in FIG. 7.

Using incident-light-position calculation circuit 1004, position signals in orthogonal coordinates (X and Y) starting with the origin defined by the center of semiconductor position sensor 1034, corresponding to the center of specimen 1001, can be obtained and a brightness signal (Z) represented in terms of the number of electrons incident upon semiconductor position sensor 1034 can also be obtained.

Pulse amplitude selector 1005 is a window-type comparator employing a first threshold L established between the mean value of the brightness signal Z obtained by incident-light-position calculation circuit 1004 due to a single electron and the output of micro-channel-plate 1033 due to thermal noises, and a second threshold H between the mean value of said brightness signal Z and the output of micro-channel-plate 1033 due to high-level noises inherently contained in said signal.

In some cases, the second threshold can be eliminated, and then signals having levels greater than the first threshold can pass through pulse amplitude selector 1005.

First address signal generator 1006 consists of an analog-to-digital converter which generates an address signal, to specify the respective counter address in two-dimensional counter array 1011, corresponding to the X and Y signals sent from incident-light-position calculation circuit 1004.

Counter 1007 is used to count the output pulses of clock pulse generator 1010, and it is reset by the horizontal and vertical sync signals from sync signal generator 1017. A count which can be reset by the vertical sync signal represents a value on the Y coordinate, and that which can be reset by the horizontal sync signal represents a value on the X coordinate.

Second address signal generator 1008 is used to convert the output of counter 1007 into a corresponding address signal to specify an address in two-dimensional counter array 1011. First select gate 1020 selects either the output (write address signal) of first address signal generator 1006 or an external address signal (read address signal); it then issues the selected one to second select gate 1009.

Second select gate 1009 selects either the output of first select gate 1020 or the output of second address signal generator 1008 in accordance with the output of divide-by-eight counter 1018; it then issues the selected one to two-dimensional counter array 1011.

Two-dimensional memory 1111 in two-dimensional counter array 1011 is composed of a plurality of counters arranged corresponding to the respective elements in a two-dimensional area.

The configuration of two-dimensional counter array 1011 will be described, in detail, referring to FIG. 12. Two-dimensional counter array 1011 consists of two-dimensional memory 1111, buffer memory 1112 connected to the respective data output terminals of two-dimensional memory 1111, third select gate 1114 which can selectively issue the outputs of buffer memory 1112 to incrementor 1115 or external circuits in accordance with the external command, incrementor 1115 which can issue input data plus one, input buffer memory 1116 connected to both incrementor 1115 and the data entry bus of two-dimensional memory 1111, and read/write controller 1121 which causes two-dimensional memory 1111 to be enabled for a read/write operation.

When the output of pulse amplitude selector 1005 is applied to first input terminal 1122 of read/write controller 1121, two-dimensional center array 1011 adds one (unit signal) to the contents of a constituent counter in the address specified by the output signal of first address signal generator 1006. This mode of operation is called counting. The contents of the counter in the address specified by second address signal generator 1008 are read for the picture monitor which will be described hereafter. The contents of two-dimensional counter array 1011 are not reset during read operations.

Counting and reading will be described hereafter in detail.

Figure 12:
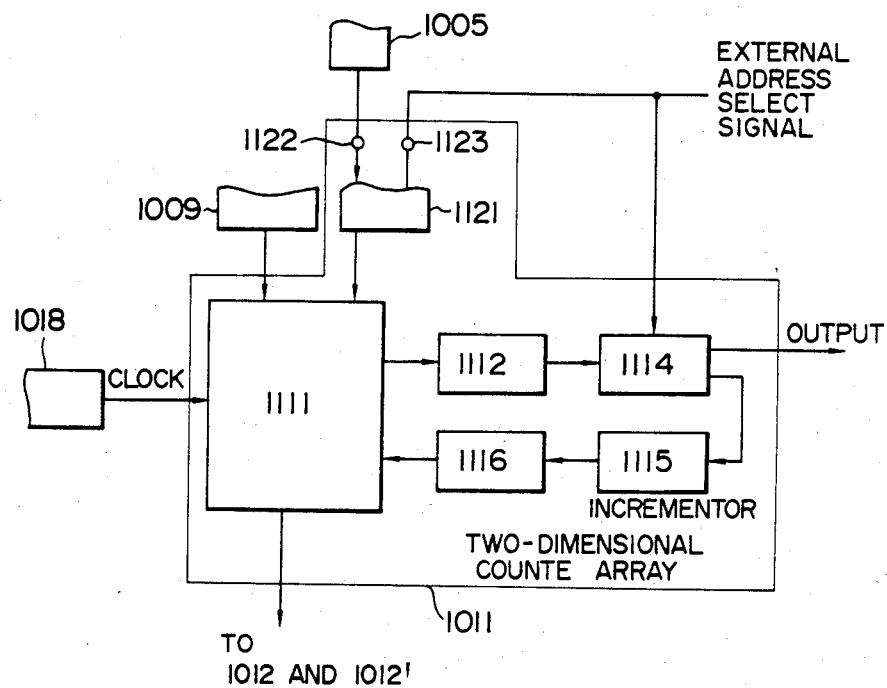
FIG. 12 shows a block diagram of the two-dimensional counter array in the second embodiment of the present invention.

Reference numbers 1128 and 1129, corresponding to 1012 and 1012' in FIG. 12, respectively, indicate buffer memories, and 1013 indicates a zero-point controller. The number of digits to be shifted at a time in the output (or parallel signal composed of a plurality of bits) of buffer memory 1128 is determined by the output of significant digit detector 1014. Significant digit detector 1014 detects the leftmost position whose value is logical 1 among the digits arranged in buffer memory 1128 in binary format. If the leftmost position whose value is logical 1 among the digits arranged in buffer memory 1128 is not greater than the digit which has been detected before, the output of significant digit detector 1014 remains unchanged. Shifting is carried out in zero-point controller 1013 until the digit specified by significant digit detector 1014 becomes the most significant digit of parallel data issued from zero-point controller 1013. Reference number 1015 indicates a digital-to-analog converter. Reference number 1019 indicates a sync signal mixer which can generate a standard NTSC television video signal from digital-to-analog converter 1015. Reference number 1016 indicates a television picture monitor used to display video signals on a CRT. This mode of operation is called reading in a television system. Only a limited number of digits starting with the most significant digit can be displayed on the TV picture monitor, and this avoids inferior contrast on the CRT due to limited dynamic range.

Figure 9:
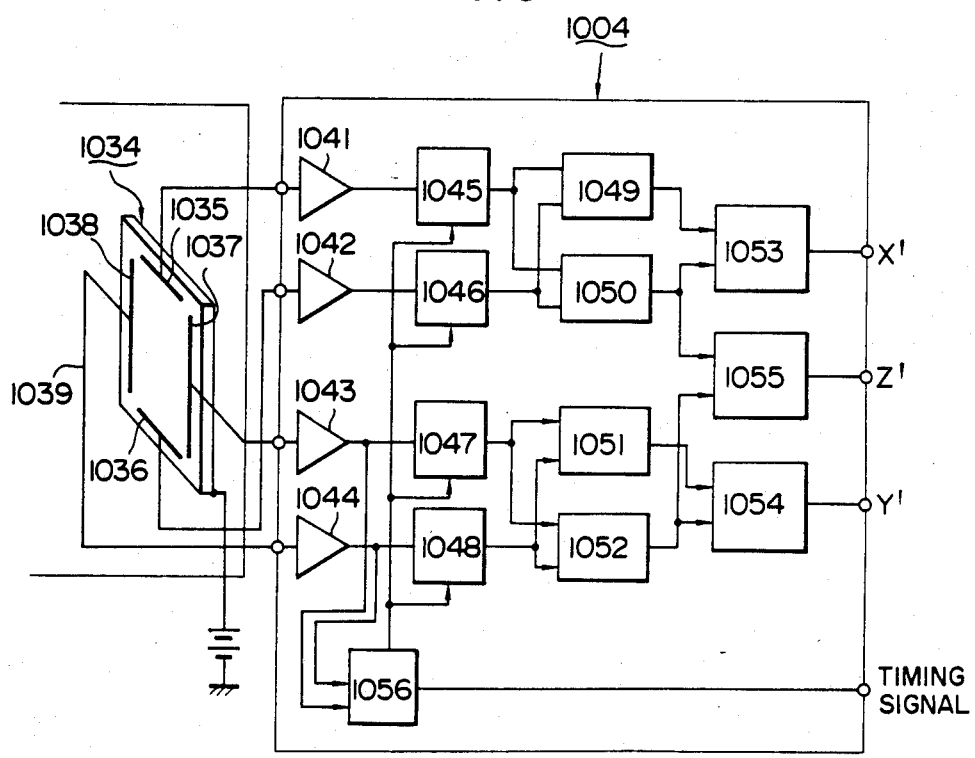
FIG. 9 shows the detailed semiconductor position sensor and the incident-light-position calculation circuit in the second embodiment of the present invention.

FIG. 9 shows a block diagram of semiconductor position sensor 1034 and incident-light-position calculation circuit 1004, which performs processing of data sent from said semiconductor position sensor 1034. Semiconductor position sensor 1034 consists of a p-n junction formed along the surface of a silicon wafer and four electronically isolated electrodes 1035, 1036, 1037 and 1038 arranged at the respective sides of a rectangular shaped area. Electrodes 1035 and 1036 are arranged opposite each other along one pair of sides, and electrodes 1037 and 1038 are arranged opposite each other along the other pair of sides. For each of the four electrodes, the electrical resistance along a path measured from an arbitrary point 1039 on the rectangular shaped area defined by four electrodes 1035, 1036, 1037 and 1038 to the respective electrode is proportional to the length of the path. When an electron falls on point 1039, currents inversely proportional to the distances from point 1039 to the respective electrodes flow. During this time, electron multiplication can occur within the bulk of the silicon wafer corresponding to the energy of electrons which fall on the p-n junction. Reference numbers 1041 through 1044 indicate pulse amplifiers. Reference numbers 1045 through 1048 indicate integrators. Timing signal generator 1056 adds the outputs of pulse amplifiers 1043 and 1044 to create a triggering signal for timing signal generation. The timing signals determine the timings at which integrators 1045, 1046, 1047 and 1048 start operating for integration, and they also determine the times of integration. For instance, the time of integration is set to be 6 $\mu$s. This time depends on the time constant for the output signal of semiconductor position sensor 1034. This time is longer tha the cycle time of a two-dimensional counter array which will be described hereafter.

If the timing signal generated by the circuit in FIG. 9 is delayed, the time of starting integration is delayed from the input signal. In this case, the accuracy of integration becomes inferior under some conditions. If any delay has occurred, delay circuits must be placed between said pulse amplifiers 1041, 1042, 1043 and 1044 and corresponding integrators 1045, 1046, 1047 and 1048, respectively.

In FIG. 9, a current flowing through electrode 1035 is amplified by pulse amplifier 1041, and the signal current obtained through integrator 1045 will be identified as I 35', current flowing through electrode 1036 is amplified by pulse amplifier 1042, and the signal current passing through integrator 1046 will be identified as I 36', current flowing through electrode 1037 is amplified by pulse amplifier 1043, and the signal current passing through integrator 1047 will be identified as I 37', and current flowing through electrode 1038 is amplified by pulse amplifier 1044, and the signal current passing through integrator 1048 will be identified as I 38'.

Adder 1050 adds I 35' and I 36' respectively sent from said integrators 1045 and 1046, and then provides an output representing the sum (I 35'+I 36').

Adder 1052 adds I 3' and I 38' respectively sent from said integrators 1047 and 1048, and then provides an output representing the sum (I 37'+I 38').

Adder 1055 adds the outputs of adders 1050 and 1052, and then provides an output representing the sum (I 35'+I 36'+I 37'+I 38').

Subtractor 1049 is used to obtain (I 35'−I 36'), and subtractor 1051 to obtain (I 37'−I 38').

Reference numbers 1053 and 1054 indicate dividers, respectively. The output signal X' of divider 1053 is given by the following expression:

$$X' = (I\ 35' - I\ 36')/(I\ 35' + I\ 36') \tag{4}$$

The output signal Y' of divider 1054 is given by the following expression:

$$Y' = (I\ 37' - I\ 38')/(I\ 37' + I\ 38') \tag{5}$$

The output signal Z' of adder 1055 is given by the following expression:

$$Z' = (I\ 35' + I\ 36' + I\ 37' + I\ 38') \tag{6}$$

Assume that the center of a square defined by electrodes 1035, 1036, 1037 and 1038 arranged at the respective sides is defined as the origin, that each of the distances from the origin to the respective electrodes be identified as unity, that the coordinate defined by the line in the direction from electrodes 1036 to 1035 be the X-axis, and that the coordinate defined by the line in the direction from electrodes 1038 to 1037 be the Y-axis. Expression (4), (5) and (6) mean the following:

Expression (4): Value on the X-axis, representing the point 1039 upon which electrons are incident, (X');

Expression (5): Value on the Y-axis, representing the point 1039 upon which electrons are incident, (Y'); and Expression (6): Number of electrons which are incident on point 1039, (Z').

The operation of the second embodiment of the measuring device built in accordance with the present invention will, in detail, be described hereafter.

Before the start of the operation, first select gate 1020 should be connected between first address signal generator 1006 and second select gate 1009, and third select gate 1114 should be connected between output buffer 1112 and incrementor 1115.

An image of electrons passing through specimen 1001 or an electron emitting plane is formed on the electron-incident plane of micro-channel-plate 1033 by means of electron lenses 1003, 1004 and 1005 of an electron microscope.

Electrons falling on micro-channel-plate 1033 are multiplied within micro-channel-plate 1033 and then the multiplied electrons arrive at the electron emitting plane of the micro-channel-plate. The multiplied electrons from the electron emitting plane fall on semi-conductor position sensor 1034 while the positional relation between images on specimen 1001 and micro-channel-plate 1033 is held unchanged.

The relation between the first and second thresholds employed by pulse amplitude selector 1005 in terms of the Z signal will be described hereafter referring to FIG. 10.

Figure 10:
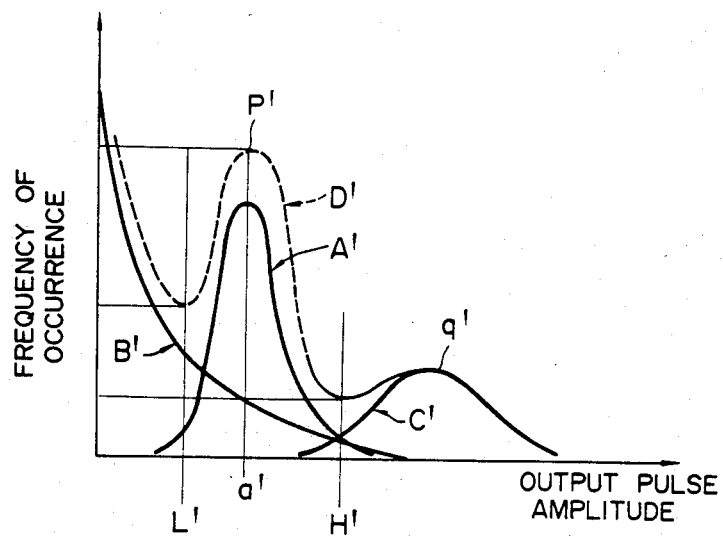
FIG. 10 shows the curves of distributions for the Z-signals issued from the incident-light-position calculation circuit in the second embodiment of the present invention.

FIG. 10 shows a set of curves with the Z signal on the X coordinate, and with the frequency of occurrence in each output range on the Y coordinate. The Z signal pulse is generated each time a single electron is generated on electron emitting plane 1001. Peak values p' and q', as shown in FIG. 10, can appear while the same value of amplitude is expected to appear when a single electron is generated. Curve D' in FIG. 10 is estimated to be given by the sum of distribution B', representing the number of times that events have occurred due to thermal noises, distribution A', representing the outputs which have occurred due to each single electron, and distribution C', representing the outputs which have occurred when electrons have been generated successively in such a manner that successive electrons cannot separately be recognized.

Thresholds L and H are established in pulse amplitude selector 1005 in accordance with the present invention, and only the Z signal falling within the range defined by two thresholds L and H, or the lower and upper limits, can thus be measured.

Both the X-coordinate and Y-coordinate signals from incident-light-position calculation circuit 1004 are converted into an address signal for two-dimensional counter array 1011 by first address signal generator 1006, and the converted signal is fed through second select gate 1009 to two-dimensional counter array 1011. The address in two-dimensional counter array 1011 can thus be specified. The maximum period of time which can be set for cyclic operation of incident-light-position calculation circuit 1004 is longer than that defined for operating two-dimensional counter array 1011, and data can be input to two-dimensional counter array 1011 only when incident-light-position calculation circuit 1004 issues outputs. Two-dimensional counter array 1011 consists of 512 by 512 or 262,144 counters; that is, two-dimensional memory 1111 has 262,144 memory locations. The Z signal is fed from incident-light-position calculation circuit 1004 to pulse amplitude selector 1005. When the Z signal is between the upper and lower limits specified by the thresholds, pulse amplitude selector 1005 issues a trigger pulse signal so as to add one to the contents of a constituent counter in the specified address of two-dimensional counter array 1011. Any trigger pulses other than those caused by thermal noises and by two or more electrons can be applied to two-dimensional counter array 1011, and thus each count signal can be set corresponding to each single electron.

The clock pulse frequency is selected so that each clock pulse corresponds to the respective address of two-dimensional counter array 1011, and also so that the retrace period of television scanning may effectively be used. As described above, the address in the X-coordinate is defined as a count set after counter 1007 is reset by the horizontal drive signal during clocking at the above clock frequency.

The counter needs not count the clock pulses for obtaining the address in the Y-coordinate. The address in the Y-coordinate can be obtained by counting the number of horizontal drive pulses after the counter is reset by the vertical drive signal. Numbers issued from counter 1007 should start with the leftmost position on the television picture monitor, so that the number in the leftmost position is identified as the origin, while the output of incident-light-position calculation circuit 1004 starts with the central position on the television picture monitor, which is identified as the origin. Compensation which will be described hereafter is thus needed for interlace scanning during a read operation. Second address signal generator 1008 converts the output of counter 1007 into an address signal for two-dimensional counter array 1011. For example, said compensation is carried out by subtracting 512/2=256 from the numbers issued from counter 1007 on the X-coordinate; and by subtracting 245 from the value twice the numbers issued from counter 1007 in each horizontal line for the first field and subtracting 244 from the same value for the second field in the Y-coordinate direction.

Figure 11:
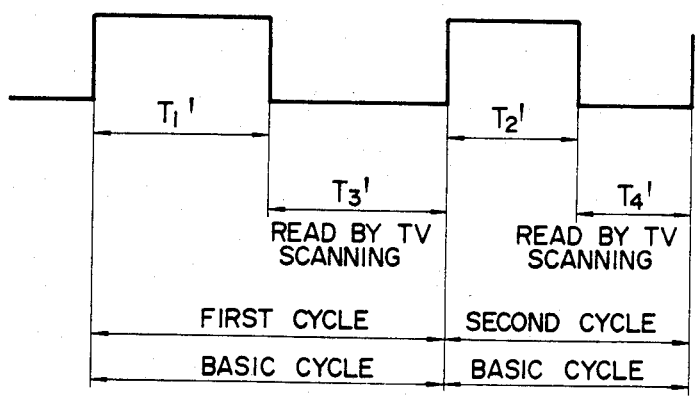
FIG. 11 shows a waveform of the pulse voltage issued from the clock pulse generator to the divide-by-eight counter in the second embodiment of the present invention.

Second select gate 1009 is controlled by the pulse signal, divided by divide-by-eight counter 1018, from clock pulse generator 1010. FIG. 11 shows the waveform of the pulse signals issued from divide-by-eight counter 1018. The pulse signals are used to control the basic timing of two-dimensional memory 1111, and each signal consists of preceding and succeeding half cycles. The signal in the preceding half cycle is logical 1 (representing the high level) and that in the succeeding half cycle is logical 0 (representing the low level).

Second select gate 1009 selects either an address signal issued from first address signal generator 1006 or an external address signal in the first half cycle, and the selected signal is used to read out the counter contents. It selects an address signal from second address signal generator 1008 in the second half cycle, and the selected signal is used to read out the contents of two-dimensional counter array 1011 in accordance with television scanning.

Pulse voltages issued from divide-by-eight counter 1018 to second select gate 1009 are also fed to two-dimensional counter array 1011. The contents of two-dimensional memory 1111 in the specified address are read out in the preceding half cycle of the basic timing $T_1'$ in FIG. 11, and then one is added to these contents by using incrementor 1115. The result of this addition is written into two-dimensional memory 1111 in the same address in the preceding half cycle of the basic timing $T_2'$ in FIG. 11. This operation allows said counting to be performed. The memory contents are nondestructively read out of eight successive addresses starting with the specified one in the succeeding half cycles of the basic timings $T_3'$ and $T_4'$ in FIG. 11. After the read out of the memory contents, these contents are used to read out data in accordance with television scanning.

The reason for reading out eight address signals from the counter at a time is as follows: If one address signal is read from the counter in an arbitrary cycle, the time needed to read out data corresponds to the period of time determined by a frequency of 9.7 MHz if both the horizontal and vertical retrace periods are not used. Each read operation must be carried out in the succeeding half cycle, and the time necessary for each read operation is 52 ns. This time either cannot be realized or lies at the limit of time which can be realized. If data is read out of eight counters at a time, the time needed to read out data at a time is 416 ns. This time is much larger than the limit of time. This mode of read operation is carried out in accordance with the horizontal and vertical synchronizing signals issed from television sync signal generator 1017. This mode of operation is called parallel-to-series conversion. As described above, two-dimensional counter array 1011 consists of 512 by 512 counters. Video signals in a single horizontal scanning line can entirely be processed by 64 read operations if the contents of eight counters are read out at a time, with a set of 512 counters correspond to one horizontal line. On the other hand, each television frame consists of video signals in 525 lines. However, 6.5% of the frame time corresponds to the vertical retrace period, and only 488 lines can be used to display video signals.

The output of eight counters within two-dimensional counter array 1011 is once stored in first buffer memory 1128, and the contents of each counter are successively read out. Data is read from first buffer memory 1128 in the succeeding one cycle which corresponds to 816 ns. In the succeeding half cycle of the above period, the contents of two-dimensional counter array 1011 are read out and transferred to second buffer memory 1129. Hence, it is easily understood that a select gate to select first buffer memory 1128 in one cycle and second buffer memory 1129 in the other cycle is needed to receive the output of two-dimensional counter array 1011. However, a description will be omitted because of the matter of clarity. Signals issued from first buffer memory 1128 or second buffer memory 1129 are fed to both zero-point controller 1013 and significant digit detector 1014. Significant digit detector 1014 can detect the leftmost digit position whose value is logical 1 among the digits issued from first buffer memory 1128 or second buffer memory 1129. This state is unchanged until logical 1 is input to any digit which is more significant than the above.

Zero-point controller 1013 shifts the input signal in accordance with the output of significant digit detector 1014. That is, shifting is carried out so that the digit position specified by significant digit detector 1014 agrees with that appearing in the output of zero-point controller 1013.

The output of zero-point controller 1013 is converted into the corresponding analog signal with digital-to-analog converter 1015, and then it is mixed with the horizontal or vertical drive signals from television sync signal generator 1017 with a sync signal mixer. The signal thus obtained is fed to the video signal input of television picture monitor 1016.

When the observer recognizes an image viewed on television picture monitor 1016 to be the result of a sufficient number of corpuscular rays, first select gate 1020 is operated by the external address select signal issued in response to manual operation. First select gate 1020 opens a gate between an external address signal generator (not shown) and second select gate 1009. The external address select signal issued from two-dimensional counter array 1011 is fed to both third select gate 1114 and second input terminal 1123 of read/write controller 1121. In the preceding half cycle of basic timings $T_1'$ and $T_2'$ in FIG. 11, the memory is operated in the read mode. A gate between output buffer 1112 and external display (not shown) is opened while another gate between output buffer 1112 and incrementor 1115 is closed. In said preceding half cycle of basic timings $T_1'$ and $T_2'$, the memory is operated in the read mode.

An arbitrary address signal is fed from said external address signal generator to first select gate 1020.

Digitally-formatted picture signals stored in two-dimensional memory 1111 of two-dimensional counter array 1011 can directly be read, and then these are fed to external display or memory through third select gate 1114.

The contents of two-dimensional memory 1111 after read operations are carried out are unchanged if compared with those before read operations are done.

A printer is an example of the external display devices, and a magnetic tape transport is an example of the external memories.

The read address may be the same as that used for displaying television picture signals or part of these signals.

The rate at which read operations are carried out corresponds to a half of the clock pulses at 9.7 MHz. The contents of each counter are read each time a read operation is carried out. These relations can satisfactorily be understood in accordance with the second embodiment of the present invention.

The present invention may be modified or varied from the first and second embodiments described above.

The principle of the present invention can also be applied to measuring invisible images of extremely low intensity such as infra-red, ultra-violet, X-ray, and γ-ray images. It should be understood that the photoelectric layer in accordance with the first embodiment of the present invention converts energy of electromagnetic beams into corresponding electrons. The device can easily be adapted for use with invisible rays by changing the properties of the window through which rays are incident on the photoelectric layer and also changing the properties of the material with which the photoelectric layer is made, so that it may correspond to the nature of the electromagnetic beam.

Photoelectric layers of gallium arsenide are suitable for measuring infra-red images of extremely low intensity.

Photoelectric layers of gallium iodide are suitable for measuring ultra-violet images of extremely low intensity. Plates of lithium fluoride are suitable for use in windows through which ultra-violet rays can impinge on the photoelectric layers.

Photoelectric layers of thin metal film can be used for measuring images of X-rays or γ-rays with extremely low intensity, and plates of beryllium and aluminum are suitable for use in windows through which X-rays or γ-rays can pass.

Figure 13:
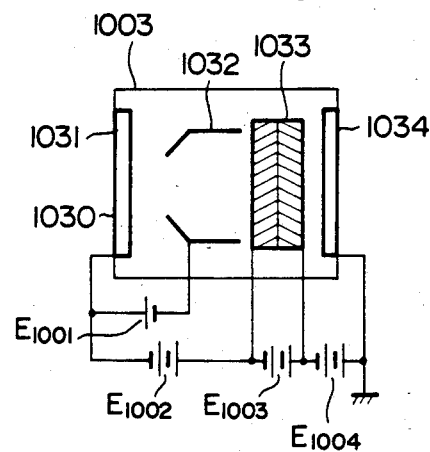
FIG. 13 shows a variation of the micro-channel-plate of FIG. 8.

Although the second embodiment of the present invention deals with electrons as the corpuscular rays, micro-channel-plate 1033 in the second embodiment of the present invention can emit secondary electrons in response to corpuscular rays of protons or neutrons. Images formed by protons or neutrons can thus be obtained. As shown in FIG. 13, micro-channel-plate 1033 and semiconductor position sensor 1034 can thus be housed in a vacuum-sealed envelope 1003 wherein layer 1031 on the inner wall thereof is used to emit electrons. In FIG. 13, reference number 1032 indicates a focusing electrode. Reference numbers E1001, E1002, E1003 and E1004 indicate the bias supplies, respectively.

The present invention can be applied to measure images formed by corpuscular rays with an appropriate energy as well as the image of mass spectral analysis due to ions in a mass spectrometer. Lead oxide can emit secondary electrons responding to several kinds of corpuscular rays and can be used for making a layer which can emit electrons.

The first embodiment of the present invention has the following features in accordance with the configuration and operation described above.

After generating a photoelectron, the measuring device is used to detect the position where the generated photoelectron strikes the photoelectric layer so as to measure a two-dimensional image, eliminating thermal noise components. The device uses, as key components, a micro-channel-plate used to multiply a single photoelectron until a finite number of electrons is obtained, an imaging tube providing a two-dimensional semiconductor position sensor, and a pulse amplitude selector used to establish a lower bound to the detected pulse signal amplitudes.

The picture signals are digitally counted by using a two-dimensional counter array, and photon-caused optical images with a high dynamic range can thus be observed. In the first embodiment of the present invention, a dynamic range of $6 \times 10^4$ was obtained by specifying an address signal, each consisting of 16 bits in the two-dimensional counter array.

Upon detection of the Z pulse signal, no incorrect location can be specified while the pulse amplitude is being limited. During this time, the effects of two or more photoelectrons incident on the micro-channel-plate at the same time can be eliminated, and noises cannot occur although they are inherent in the photon-caused signal. A more detailed image than has ever been obtained previously can thus be detected.

Images can be observed online by displaying the television picture signals from the two-dimensional counter array, and the timing relation needed to read out the picture information during the appropriate period of time can thus be known.

The second embodiment of the present invention has the following features in accordance with the configuration and operation described above.

After generating an electron, the measuring device is used to detect the position where the electron is generated so as to measure a two-dimensional image, eliminating thermal noise components. The device uses, as key components, a micro-channel-plate used to multiply a single electron until a finite number of electrons is obtained, a two-dimensional semiconductor position sensor, and a pulse amplitude selector used to establish a lower bound to the detected pulse signal amplitudes.

The image signals are digitally counted by using a two-dimensional counter array, and corpuscular-ray-caused optical images with high dynamic range can thus be observed. In the second embodiment of the present invention, a dynamic range of $6 \times 10^4$ was obtained by specifying an address signal, each consisting of 16 bits in the two-dimensional counter array.

Upon detection of the Z pulse signal, no incorrect location can be specified while the pulse amplitude is being limited. During this time, the effects of two or more electrons incident on the micro-channel-plate at the same time can be eliminated and noises cannot occur although they are inherent in the corpuscular-ray-caused signal.

A more detailed image than has ever been obtained previously can thus be detected.

Images can be observed online by displaying the television picture signals from the two-dimensional counter array, and the timing relation needed to read out the picture information during the appropriate period of time can thus be known.

What is claimed is:

1. A device for measuring two-dimensional photon-caused image signals which are generated due to photoelectrons which can separately be observed in a time sequence in response to light from an object being measured, comprising:

an imaging tube which includes a photoelectric layer to emit said photoelectrons when light from the object being measured is incident on said photoelectric layer, a micro-channel-plate which has an electron emitting side and which multiplies each electron generated each time a unit of photons strikes said photoelectric layer so that said each electron is multiplied to provide a finite number of electrons which are emitted from said electron emitting side, and a two-dimensional semiconductor position sensor which has position signal electrodes and which is located adjacent the electron emitting side of said micro-channel-plate, said micro-channel-plate being disposed between said photoelectric layer and said semiconductor position sensor;

incident-light-position calculation circuit means for issuing a position signal representing the location where said finite number of electrons strike said two-dimensional position sensor after an arithmetic operation is carried out on the outputs of the position signal electrodes of said two-dimensional semiconductor position sensor, said incident-light-calculation circuit means including a number-of-electrons calculation circuit means for estimating the number of electrons generated by adding said outputs of the position signal electrodes of said two-dimensional semiconductor position sensor, said numbers-of-electrons calculation circuit means providing an output signal having a signal component which results when a single photoelectron is generated on said photoelectric layer, a low-level thermal noise component, and a high-level noise component which results when a plurality of photoelectrons are generated simultaneously on said photoelectric layer;

pulse amplitude selector means for generating a decision signal to indicate whether or not the output signal of said number-of-electrons calculation circuit means corresponds to a single photoelectron level when said number-of-electrons calculation circuit means is operating, said pulse amplitude selector means having an output port and providing a first threshold to dissect, at the output port thereof, said low-level thermal noise component from said signal component caused by a single photoelectron, and a second threshold to dissect, at the output port thereof, said high-level noise component caused by simultaneous occurrence of a plurality of photoelectrons from said signal component caused by a single photoelectron; and means including a two-dimensional counter array for adding one, every time a decision signal is generated by said pulse amplitude selector means, to the contents of a constituent counter at an address corresponding to said position signal issued by said incident-light-position calculation circuit means.

2. A device for measuring two-dimensional photon-caused image signals in accordance with claim 1, further comprising:

at least one output device and means for transferring the contents of said two-dimensional counter array to said at least one output device.

3. A device for measuring two-dimensional photon-caused image signals in accordance with claim 2, wherein said at least one output device includes a television picture monitor on which the contents of said two-dimensional counter array, being used for measurement, are displayed in real time, and wherein said means for transferring comprises first and second buffers to alternately receive the contents of a plurality of counters, and means responsive to the contents of sad buffers for generating a television signal.

4. A device for measuring two-dimensional photo-caused image signals in accordance with claim 3, wherein said at least one output device further includes a printer used to print out numerical data sent from said two-dimensional counter array.

5. A device for measuring the two-dimensional photon-caused image signals in accordance with claim 3, wherein said at least one output device further includes a transport for magnetic tape to save the contents of said two-dimensional counter array.

6. A device for measuring two-dimensional image signals which are generated due to corpuscular rays from an object being measured and which can separately be observed in a time sequence, comprising:

an electron emitting layer which emits electrons when corpuscular rays from said object being measured are incident on said electron emitting layer;

a micro-channel-plate which has an electron emitting side and which multiplies each electron generated each time a unit of the corpuscular rays strikes said electron emitting layer so that said each electron is multiplied to become a finite number of electrons which are emitted from said electron emitting side;

a two-dimensional position sensor which has position signal electrodes and which is located adjacent said electron emitting side of said micro-channel-plate;

incident-light-position calculation circuit means for issuing a position signal representing the location where a finite number of electrons strike said two-dimensional position sensor after an arithmetic operation is carried out on the outputs of the position signal electrodes of said two-dimensional semiconductor position sensor, said incident-light-position calculation circuit means additionally including a number-of-electrons calculation circuit means for estimating the number of electrons generated by adding said outputs of the position signal electrodes of said two-dimensional semiconductor position sensor, said number-of-electrons calculation circuit means providing an output signal having a signal component which results when a single electron is generated on said electron emitting layer, a low-level thermal noise component, and a high-level noise component which results when a plurality of electrons are generated simultaneously on said electron emitting layer;

pulse amplitude selector means for generating a decision signal to indicate whether or not the output signal of said number-of-electrons calculation circuit means corresponds to a single electron level when said number-of-electrons calculation circuit means is operating, said pulse amplitude selector means having an output port and providing a first threshold to dissect, at said output port thereof, said low-level thermal noise component from said signal component caused by a single electron from said electron emitting layer and a second threshold to dissect, at said output port thereof, said high-level noise component caused by simultaneous occurrence of a plurality of electrons from said signal component caused by a single electron from said electron emitting layer; and means including a two-dimensional counter array for adding one, every time one decision signal is generated by said pulse amplitude selector means, to the contents of a constituent counter at an address corresponding to said position signal issued by said incident-light-position calculation circuit means.

7. A device for measuring two-dimensional image signals in accordance with claim 6, wherein said corpuscular rays are electrons emitted from the electron gun of an electron microscope, and said electron emitting layer consists of a specimen mounted on said electron microscope.

8. A device for measuring two-dimensional image signals in accordance with claim 6, further comprising:

at least one output device and means for transferring the contents of said two-dimensional counter array to said at least one output device.

9. A device for measuring two-dimensional image signals in accordance with claim 8, wherein said at least one output device includes a television picture monitor on which signals corresponding to the contents of said two-dimensional counter array, being used for measurement, are displayed in real time, and wherein said means for transferring comprises first and second buffers to alternately receive the contents of a plurality of counters, and means responsive to the contents of said buffers for generating a television signal.

10. A device for measuring two-dimensional image signals in accordance with claim 9, wherein said at least one output device further includes a printer used to print out numerical data sent from said two-dimensional counter array.

11. A device for measuring two-dimensional image signals in accordance with claim 9, wherein said at least one output device further includes a transport for magnetic tape to save the contents of said two-dimensional counter array.

12. A device for measuring two-dimensional image signals due to rays, comprising:

an electron-emitting layer that emits electrons when struck by said rays;

a micro-channel-plate electron multiplier that receives electrons from said electron-emitting layer and generates a plurality of output electrons from each electron received;

a two-dimensional position sensor to receive said output electrons from said micro-channel-plate, said position sensor having a plurality of sensor electrodes;

position calculation circuit means connected to said sensor electrodes for generating X and Y position signals identifying where said output electrons are received on said position sensor and for generating a brightness signal having a magnitude corresponding to the number of output electrons received;

a memory array having a plurality of addressable memory locations;

addressing means responsive to said X and Y position signals for addressing memory locations in said memory array;

pulse amplitude selector means responsive to said brightness signal for comparing said brightness signal to a first predetermined voltage corresponding to low-level thermal noise and for emitting a trigger pulse if the magnitude of said brightness signal exceeds that of said first voltage; and counting means responsive to said trigger pulse for changing the content of an addressed memory location by one when said pulse amplitude selector means generates a trigger pulse.

13. A device as claimed in claim 12, wherein said counting means comprises means for adding one to the content of an addressed memory location when said pulse amplitude selector means generates a trigger pulse.

14. A device as claimed in claim 12, wherein said counting means comprises means for reading out the content of an addressed memory location, adding one thereto, and storing the sum at the addressed memory location.

15. A device as claimed in claim 12, wherein said memory array comprises a plurality of counters.

16. A device as claimed in claim 12, wherein said pulse amplitude selector means further comprises means for comparing said brightness signal to a second predetermined voltage that is greater in magnitude than said first predetermined voltage, said trigger pulse being emitted if the magnitude of said brightness signal lies between said first and second voltages.

17. A device as claimed in claim 16, wherein said counting means comprises comprises means for adding one to the content of an addressed memory location when said pulse amplitude selector means generates a trigger pulse.

18. A device as claimed in claim 12, wherein said rays are electrons emitted from the electron gun of an electron microscope, and said electron-emitting layer comprises a specimen mounted on said electron microscope.

19. A device as claimed in claim 18, further comprising a television monitor and means for displaying the content of said memory array on said monitor.

20. A device as claimed in claim 19, wherein said pulse amplitude selector means further comprises means for comparing said brightness signal to a second predetermined voltage that is greater in magnitude than said first predetermined voltage, said trigger pulse being emitted if the magnitude of said brightness signal lies between said first and second voltages.

21. A device as claimed in claim 12, wherein said rays are photons from an object being measured and said electron-emitting layer is a photoelectric layer which emits photoelectrons when struck by photons.

22. A device as claimed in claim 21, further comprising a television monitor and means for displaying the content of said memory array on said monitor.

23. A device as claimed in claim 22, wherein said pulse amplitude selector means further comprises means for comparing said brightness signal to a second predetermined voltage that is greater in magnitude than said first voltage, said trigger pulse being emitted if the magnitude of said brightness signal lies between said first and second voltages.

24. A device as claimed in claim 12, wherein said rays are corpuscular rays from an object being measured.

25. A device as claimed in claim 24, further comprising a television monitor and means for displaying the content of said memory array on said monitor.

26. A device as claimed in claim 25, wherein said pulse amplitude selector means further comprises means for comparing said brightness signal to a second predetermined voltage that is greater in magnitude than said first predetermined voltage, said trigger pulse being emitted if the magnitude of said brightness signal lies between said first and second voltages.

* * * * *